(12) United States Patent
Kim

(10) Patent No.: US 9,105,729 B2
(45) Date of Patent: Aug. 11, 2015

(54) DISPLAY SUBSTRATE

(71) Applicant: Samsung Display Co., LTD., Yongin, Gyeonggi-Do (KR)

(72) Inventor: Tae-Uk Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/966,844

(22) Filed: Aug. 14, 2013

(65) Prior Publication Data

US 2014/0291684 A1 Oct. 2, 2014

(30) Foreign Application Priority Data

Apr. 2, 2013 (KR) .......................... 10-2013-0035920

(51) Int. Cl.
*H01L 29/786* (2006.01)
*G02F 1/1362* (2006.01)
*H01L 27/12* (2006.01)

(52) U.S. Cl.
CPC ...... *H01L 29/7866* (2013.01); *G02F 1/136227* (2013.01); *H01L 27/124* (2013.01)

(58) Field of Classification Search
CPC .............. G02F 1/134363; G02F 2001/134372; H01L 27/124
See application file for complete search history.

(56) References Cited

U.S. PATENT DOCUMENTS

| | | | |
|---|---|---|---|
| 6,888,586 B2 * | 5/2005 | Yoo et al. ......................... | 349/43 |
| 2005/0088598 A1 * | 4/2005 | Matsumori et al. ........... | 349/139 |
| 2007/0187689 A1 | 8/2007 | Oh et al. | |
| 2008/0017884 A1 * | 1/2008 | Jeong et al. ................... | 257/203 |
| 2010/0053526 A1 * | 3/2010 | Kye et al. ....................... | 349/124 |
| 2011/0199565 A1 * | 8/2011 | Kunimatsu et al. ........... | 349/123 |
| 2012/0161137 A1 | 6/2012 | Lee | |

FOREIGN PATENT DOCUMENTS

| | | | |
|---|---|---|---|
| KR | 1020060019978 A | | 3/2006 |
| KR | 1020070082157 A | | 8/2007 |
| KR | 1020080004799 A | | 1/2008 |
| KR | 1020120073905 A | | 7/2012 |

* cited by examiner

*Primary Examiner* — Tucker Wright
(74) *Attorney, Agent, or Firm* — Robert E. Bushnell, Esq.

(57) ABSTRACT

A display substrate including a base substrate having a switching device, a first insulating layer over the base substrate having a contact hole partially exposing an electrode of the switching device, a first electrode over the first insulating layer, a second insulating layer over the first electrode, and a second electrode over the second insulating layer, wherein at least one of the first electrode and the second electrode is coupled to the electrode of the switching device through the contact hole, wherein at least one of the first electrode and the second electrode is formed in regions other than a peripheral region of the contact hole to prevent delamination and shorting of the pixel and common electrodes.

16 Claims, 4 Drawing Sheets

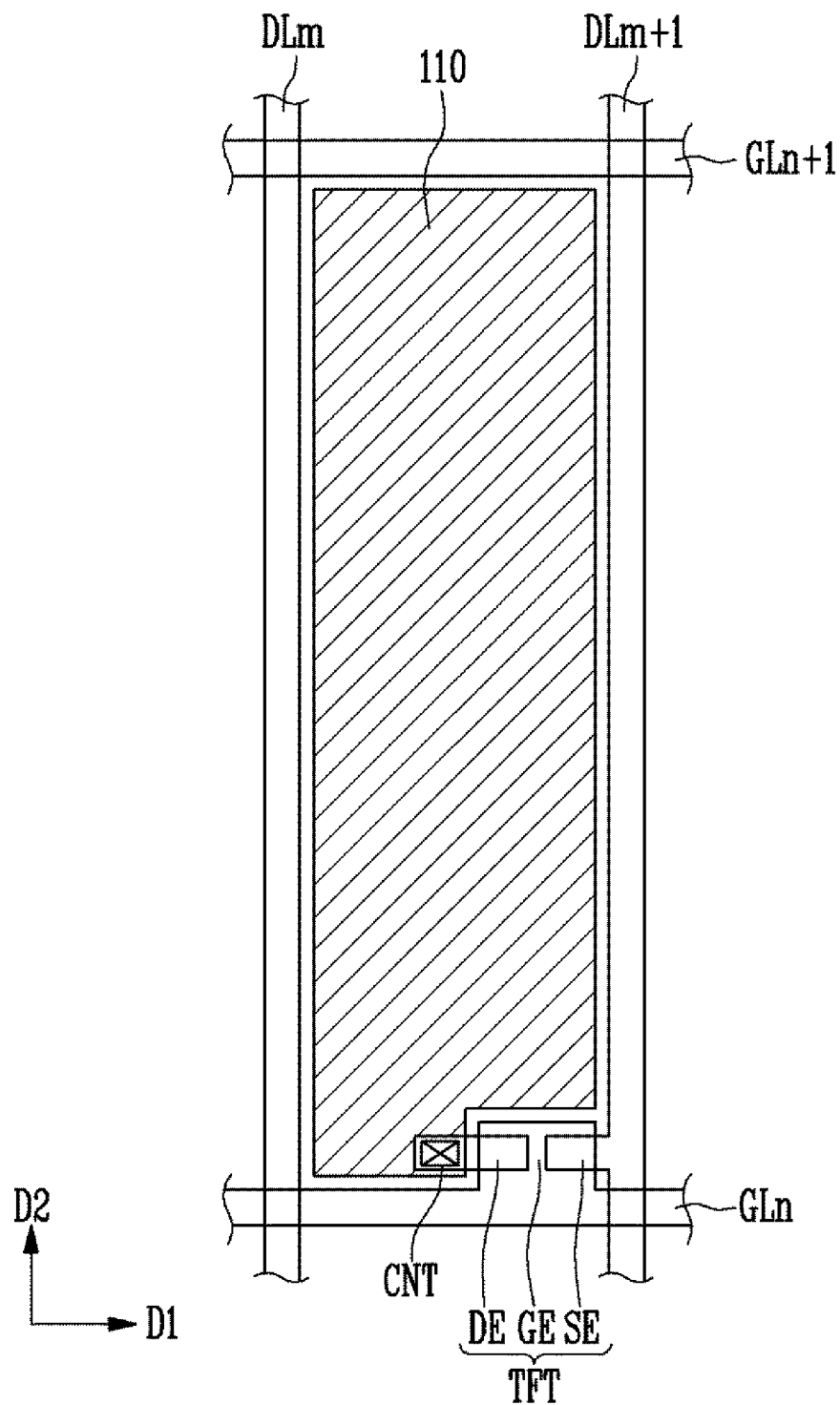

DISPLAY SUBSTRATE

CLAIM OF PRIORITY

This application makes reference to, incorporates the same herein, and claims all benefits accruing under 35 U.S.C. §119 from an application earlier filed in the Korean Intellectual Property Office filed on Apr. 2, 2013 and there duly assigned Serial No. 10-2013-0035920.

BACKGROUND OF THE INVENTION

1. Field of the Invention

An embodiment of the present invention relates to a display substrate of a liquid crystal display.

2. Description of the Related Art

A liquid crystal display applies an electric field to a liquid crystal material having anisotropic permittivity and provided between an array substrate where thin film transistors and a color filter substrate are formed. By adjusting the intensity of the electric field and thereby adjusting the amount of light penetrating into the substrate, the liquid crystal display obtains a desired pixel signal.

The in-plane switching (IPS) or plane to line switching (PLS) liquid crystal display is proposed to increase the speed of response and enhance the field of view. Since the in-plane switching (IPS) or plane to line switching (PLS) liquid crystal display rotates liquid crystal molecules within a plane parallel to the substrate, the difference in anisotropy of refraction index of liquid crystal that the observer sees is small. Also, since there may be two liquid crystal layers with opposing rotation directions of the liquid crystal molecules in the vertical section, the phase difference of light may be compensated and a wide field of view may be achieved.

In the liquid crystal display of the lateral electric field method, the pixel electrode and the common electrode may be formed over the same substrate, and the in-plane switching (IPS) or plane to line switching (PLS) may be in the direction of the electric field parallel to the substrate. The pixel electrode and the common electrode may have a stacked structure on one side of the substrate having an insulating layer in-between. The pixel electrode may be coupled to the switching device through the contact hole.

SUMMARY OF THE INVENTION

According to one aspect of the present invention, there is provided a display substrate that includes a base substrate including a switching device including an electrode, a first insulating layer arranged over the base substrate and being perforated by a contact hole exposing the electrode of the switching device, a first electrode arranged over the first insulating layer, a second insulating layer arranged over the first electrode and a second electrode arranged over the second insulating layer, wherein the first electrode may be coupled to the electrode of the switching device via the contact hole, and wherein a presence of at least one of the first electrode and the second electrode over a surface area of a peripheral region of the contact hole may be minimized. The display substrate may also include a light shielding area that overlaps a region corresponding to the contact hole and the peripheral region of the contact hole. The peripheral region of the contact hole may include a slanted area of the first insulating layer near the contact hole, the slanted area may have a predetermined slope angle.

The first electrode may be a pixel electrode and the second electrode may be a common electrode. The first insulating layer may have a thickness of 2 to 3 microns and a thickness of the second insulating layer may be about 70 nm. The common electrode may be absent from the contact hole and from the peripheral region about the contact hole. The switching device may include a gate electrode, a source electrode and a drain electrode, the drain electrode may be coupled to the pixel electrode via the contact hole. The display substrate may also include a metal layer between the drain electrode and the pixel electrode. The first electrode and the second electrode may each include a transparent electrode material. The second electrode may be patterned to include a plurality of branch electrodes in parallel with each other. The display substrate may also include a plurality of data lines and a plurality of gate lines over the substrate and coupled to the switching device. The pixel electrode may be absent from a majority of a surface area of the peripheral region about the contact hole. Except for where the pixel electrode is electrically connected to the electrode of the switching device, the pixel electrode may be absent from the peripheral region about the contact hole.

According to another aspect of the present invention, there is provided a display substrate that includes a base substrate including a switching TFT including a drain electrode, first insulating layer arranged over the base substrate and being perforated by a contact hole exposing the drain electrode of the switching TFT, the first insulating layer may have a curved and slanted profile in a peripheral region about the contact hole, a pixel electrode arranged over the first insulating layer, a second insulating layer arranged over the first electrode and a common electrode arranged over the second insulating layer, wherein the pixel electrode may be coupled to the drain electrode of the switching TFT via the contact hole, and wherein at least one of the pixel electrode and the common electrode may be absent from a majority of a surface area of the peripheral region of the contact hole to prevent the common electrode and the pixel electrode from delaminating and shorting together within the peripheral region of the contact hole.

The peripheral region of the contact hole may include a slanted area of the first insulating layer near the contact hole, the slanted area may have a predetermined slope angle. The common electrode may be absent from the contact hole and from the peripheral region about the contact hole. The pixel electrode may be absent from a majority of a surface area of the peripheral region about the contact hole. Except for where the pixel electrode is electrically connected to the electrode of the switching device by a coupling pattern, the pixel electrode may absent from the peripheral region about the contact hole. The common electrode may be absent from the contact hole and from the peripheral region about the contact hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a plan view illustrating a unit pixel describing a pixel electrode of a display substrate according to a first embodiment of the present invention;

DETAILED DESCRIPTION OF THE INVENTION

Hereinafter, exemplary embodiments of the present invention will be described in detail with reference to the accompanying drawings.

Figure 1B:
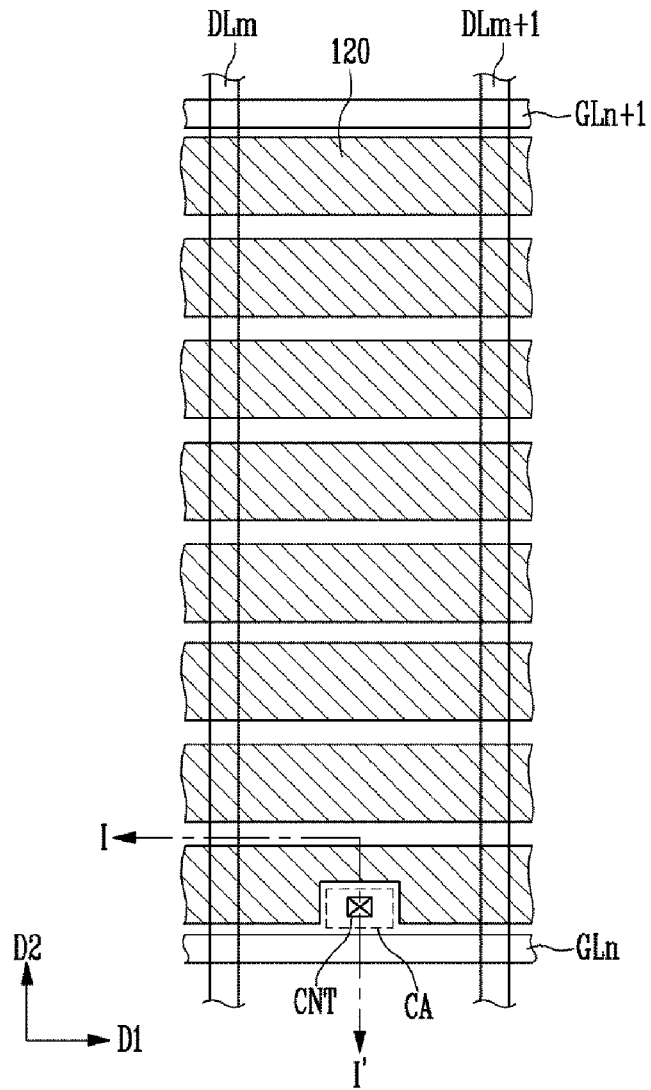
FIG. 1B is a plan view illustrating a unit pixel describing a common electrode of a display substrate according to a first embodiment of the present invention.
Figure 2:
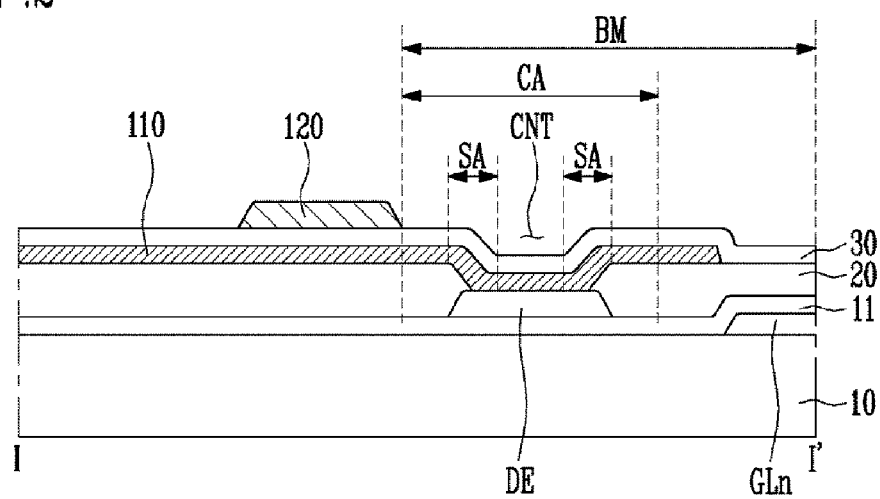
FIG. 2 is a cross-sectional view illustrating the display substrate in the direction of a line I-I' direction of FIG. 1B.

Turning now to FIGS. 1A through 2, FIG. 1A is a plan view describing a pixel electrode 110, FIG. 1b is a plan view describing a common electrode 120 overlapping the pixel electrode 110 and FIG. 2 is a cross-sectional view illustrating the display substrate in the direction of the line I-I' direction of FIG. 1B according to a first embodiment of the present invention. The display substrate may be an in-plane switching (IPS) mode or a plane to line switching (PLS) mode. The display substrate may be a stacked structure having the pixel electrode 110 and the common electrode 120 over the base substrate 10. Although the unit pixel of the display substrate is shown in an enlarged form in FIGS. 1A and 1B for convenience, the display substrate has a structure in which the unit pixel structure of FIGS. 1A and 1B is repetitively disposed over a base substrate 10, often in a matrix form.

Referring to FIGS. 1A, 1B and 2, the display substrate according to the first embodiment includes a base substrate 10, a first insulating layer 20 sequentially stacked over the base substrate 10, the pixel electrode 110, a second insulating layer 30 and the common electrode 120. The display substrate according to the first embodiment provides that the common electrode 120 that has a TOP-COM structure formed over the pixel electrode 110, however, in another embodiment, the pixel electrode may instead be formed over the common electrode.

The base substrate 10 may be glass formed of a transparent material capable of allowing light to pass through. Also, the base substrate 10 may include triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cycloolefin polymer (COP), etc.

A pixel region of the unit pixel is defined by the gate lines GLn and GLn+1 and the data lines DLm and DLm+1. The gate lines GLn and GLn+1 and the data lines DLm and DLm+1 intersect each other while being insulated from the each other by the gate insulating layer 11. Each pixel also includes a switching device TFT coupled to the gate lines GLn and GLn+1 and the data lines DLm and DLm+1. For example, the gate lines GLn and GLn+1 may extend in a first direction D1, and the second gate line GLn+1 is spaced apart in a second direction D2 orthogonal to the first direction D1 from the first gate line GLn. The data lines DLm and DLm+1 extend in the second direction D2 of the base substrate 10 and are spaced-apart from each other in the first direction D1.

The gate lines GLn and GLn+1 and the data lines DLm and DLm+1 may be made out of an aluminum series metal such as aluminum (Al), an aluminum alloy, etc., a silver series metal such as silver (Ag), a silver alloy, etc., a copper series metal such as copper (Cu), a copper alloy, etc., a molybdenum series metal such as molybdenum (Mo), a molybdenum alloy, etc., chrome (Cr), tantalum (Ta) and/or titanium (Ti).

Also, the gate lines GLn and GLn+1 and the data lines DLm and DLm+1 may instead have a multi-layered structure including two conductive layers (not shown) having physical properties that are different from each other. One of the conductive layers may be formed of a metal having low resistivity, such as the aluminum series metal, the silver series metal, the copper series metal, etc., in order to reduce signal delays or voltage drops. The other conductive layers may be formed of a different material excellent in physical, chemical, electrical contact characteristics with indium tin oxide (ITO) and indium zinc oxide (IZO), such as molybdenum series metal, Cr, Ta, Ti, etc.

A gate insulating layer 11 may be made out of silicon nitride (SiNx) or silicon oxide (SiOx) and may be formed over the gate lines GLn and GLn+1. The switching devices TFT are coupled to the gate lines GLn and GLn+1 and the data lines DLm and DLm+1, respectively. The switching device TFT may supply electrical signals to the pixel electrodes 110 and may be a thin film transistor TFT that is turned on in response to gate signals. The switching device TFT may include a gate electrode GE, a channel layer (not shown) over the gate electrode GE, and a source electrode SE and a drain electrode DE over the channel layer. The gate electrode GE of the switching device TFT may be coupled to the first gate line GLn, the source electrode SE may be coupled to the first data line DLm, and the drain electrode may be spaced apart from the source electrode SE.

The first insulating layer 20 may be formed over the base substrate 10, completely covering the gate lines GLn and GLn+1, the data lines DLm and DLm+1 and the switching device TFT. The first insulating layer 20 may also serve to flatten a surface of the base substrate 10. The first insulating layer 20 may be made out of an inorganic insulating material or an organic insulating material. The first insulating layer 20 made out of the organic insulating material may have a dielectric constant of 4.0 or less and also may be photosensitive. In a variation of the first embodiment, the first insulating layer 20 may instead be a stacked structure of double layers having a lower inorganic layer and an upper organic layer. The first insulating layer 20 may be partially removed to form a contact hole CNT that exposes the drain electrode DE of the switching device TFT so that the pixel electrode 110 and the drain electrode DE may be coupled via the contact hole CNT. The peripheral region CA of the contact hole CNT is, as seen from the cross section of the display substrate in FIG. 2, a region including a slanted area SA of the first insulating layer 20, the slanted area SA having a predetermined slope angle near the contact hole CNT. As a result, the profile of the first insulating layer 20 may be slanted and/or curved about the contact hole CNT.

The contact hole CNT may overlap a light shielding area BM of the base substrate 10 in order to prevent the contact hole from being seen. In the light shielding area BM, light is blocked off by a black matrix of an upper substrate (not shown) facing the display substrate. The light shielding area BM may also cover and correspond to the gate lines GLn and GLn+1 and the data lines DLm and DLm+1 that sectionalize the unit pixels, in addition to covering the contact hole CNT and a peripheral region CA of the contact hole CNT.

The pixel electrode 110 may be formed over the first insulating layer 20 and may completely cover the unit pixels defined by the boundary of the gate lines GLn and Gln+1 and the data lines DLm and DLm+1. Also, the pixel electrode 110 may be coupled to the drain electrode DE of the switching device TFT through the contact hole CNT that partially opens up the first insulating layer 20. There may also be an additional metal layer (not shown) between the pixel electrode 110 and the drain electrode DE. The pixel electrode 110 may be made out of a transparent conductive material such as ITO or IZO, etc. or an opaque metal such as aluminum, silver, chrome or an alloy thereof, etc.

The pixel electrode 110 may overlap the common electrode 120, and the pixel electrode 110 receives a pixel data voltage applied to the pixel electrode 110 through the switching device TFT, thereby forming one side of a storage capacitor. A common electrode voltage Vcom is applied to the common electrode 120, and the common electrode 120 forms the other side of the storage capacitor.

The second insulating layer 30 may be formed over the pixel electrode 110 and may have a thickness of about 70 nm. The second insulating layer 30 may be formed very thin as compared to the first insulating layer 20 having a thickness of about 2 μm to 3 μm.

The common electrode 120 may be formed over the second insulating layer 30 such that it overlaps at least a part of the pixel electrode 110. Unlike the pixel electrode 110, the common electrode 120 may completely cover the entire display in one sheet and may not have regions corresponding to individual unit pixels insulated from one another. The material and the shape of the pixel electrode 110 and the common electrode 120 may vary and still be within the scope of the present invention is not limited thereto. Like the pixel electrode 110, the common electrode 120 may be made out of a transparent conductive material such as indium tin oxide (ITO) and indium zinc oxide (IZO) such that the common electrode 120 and the pixel electrode 110 may have high electric conductivity and high optical transmissivity. The pixel electrode 110 and the common electrode 120 may be patterned by a photo mask pattern.

In the first embodiment of FIGS. 1A, 1B and 2, the common electrode 120 may be absent from the contact hole CNT and the peripheral region CA about the contact hole CNT. Also in the first embodiment and as illustrated in FIG. 1B, the common electrode 120 may include a plurality of branches extending parallel to one another in the first direction D1, and thus may be in parallel with the data lines DLm and DLm+1 and may be spaced apart from each other and have a line shape or a bar shape.

In the slanted area SA of the peripheral region CA of the contact hole CNT, the profile of the first insulating layer 20 changes and becomes slanted and/or curved about the contact hole CNT. As a result of the profile of the first insulating layer 20 in the slanted area SA, some parts of the pixel electrode 110 or the common electrode 120 near the contact hole CNT may lift up. The lifting phenomenon of the electrode pattern could cause the electrode pattern to perforate the first insulating layer 20 in the slanted area SA, thereby resulting in an electrical short between the pixel electrode 110 and the common electrode 120.

The present invention seeks to reduce or eliminate the chances of such a defect and such an electrical short from forming by either minimizing or eliminating at least one of the pixel electrode 110 and the common electrode 120 from the slanted area SA and the peripheral region CA about the contact hole CNT. In the first embodiment of FIGS. 1A, 1B and 2, it is the common electrode 120 that is eliminated from the slanted area SA and the peripheral region CA of the contact hole CNT. The common electrodes 120 in the peripheral region CA of the contact hole may be selectively removed by an additional strip process.

Figure 3A:
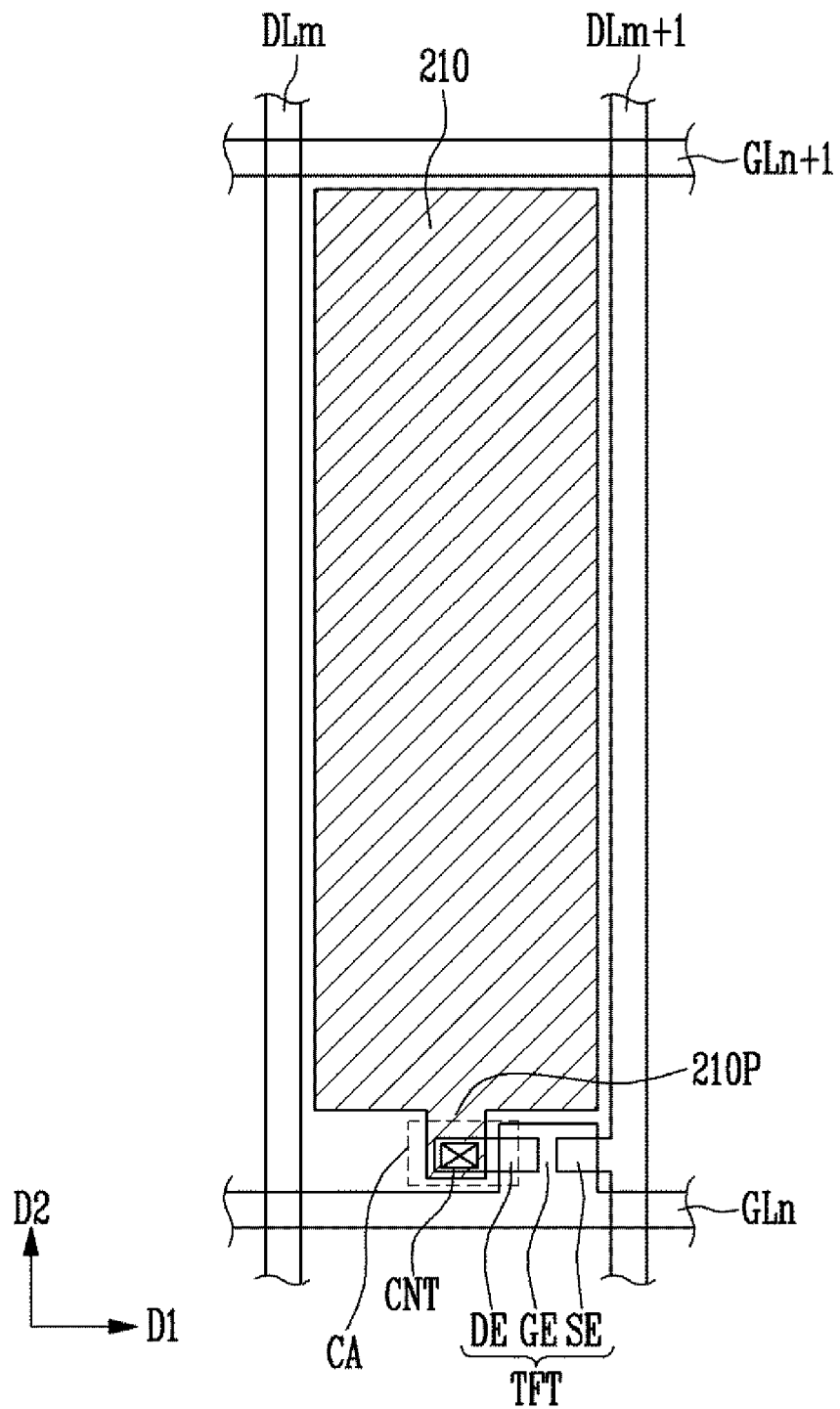
FIG. 3A is a plan view illustrating a unit pixel describing a pixel electrode of a display substrate according to a second embodiment of the present invention.
Figure 3B:
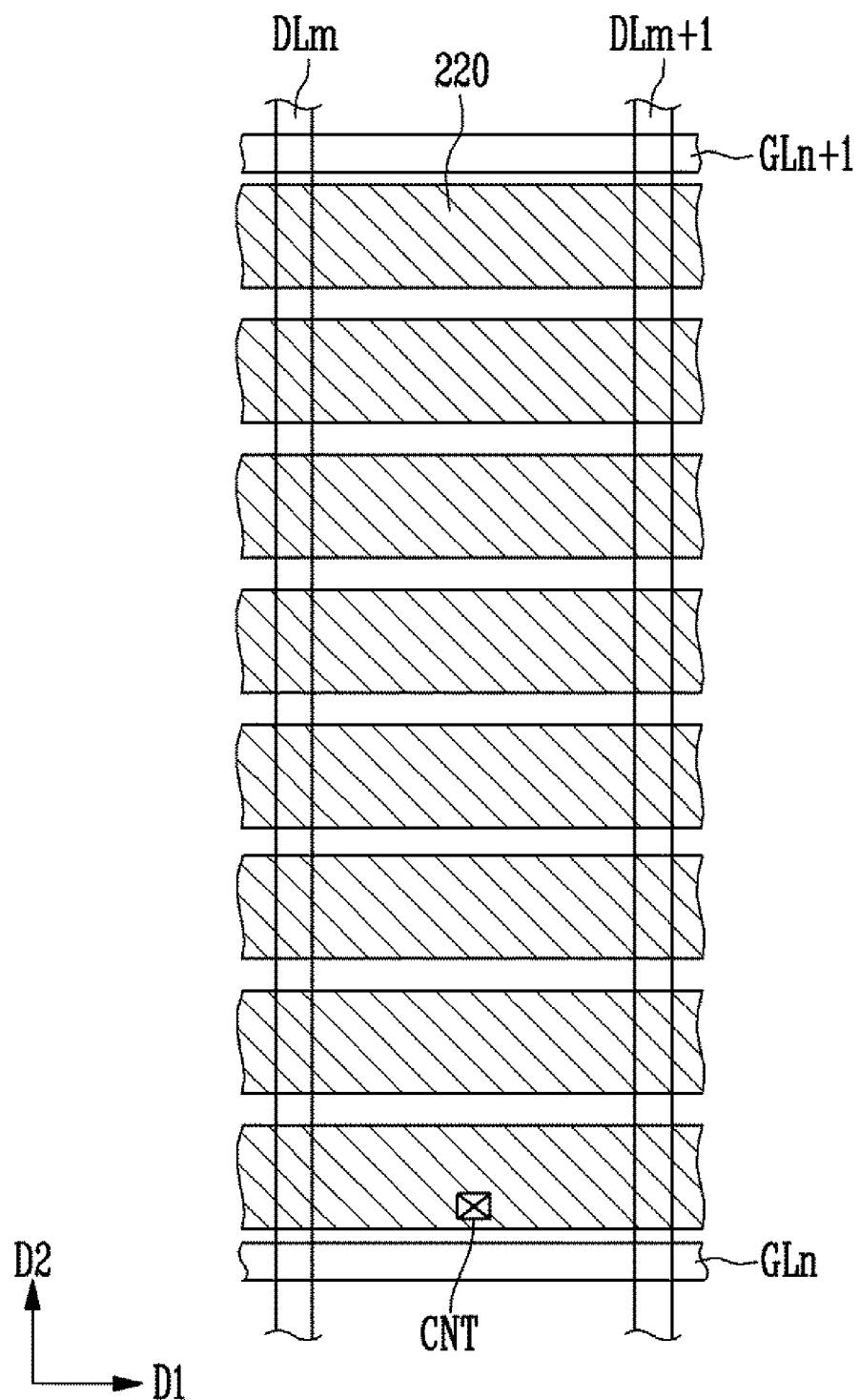
FIG. 3B is a plan view illustrating a unit pixel describing a common electrode of a display substrate according to a second embodiment of the present invention.

Turning now to FIGS. 3A and 3B, FIGS. 3A and 3B are plan views illustrating a unit pixel of a display substrate according to a second embodiment of the present invention. Referring now to FIGS. 3A and 3B, in the display substrate according to a second embodiment, the presence of the pixel electrode 210 in the peripheral region CA of the contact hole CNT is minimized, while the common electrode extends throughout the peripheral region CA of the contact hole CNT. Because the pixel electrode 210 is to be coupled to the contact hole CNT by a contact hole coupling pattern 201P, the only presence of the pixel electrode 210 within peripheral region CA of the contact hole CNT is the minimal contact hole coupling pattern 210P.

Here, the contact hole coupling pattern 210P is a pattern in which the pixel electrode 210 is extended in order to form electrical contact with the electrode of the switching device TFT through the contact hole CNT. The pixel electrode 210 and the contact hole coupling pattern 210P may be formed in one body.

In the second embodiment of the present invention, the contact hole coupling pattern 210P may take up a minimal area for coupling the pixel electrode 210 to the electrode of the switching device TFT. In the second embodiment, the common electrode 220 may completely cover the peripheral region CA of the contact hole without excluding any area.

In a third embodiment, as in the case of the common electrode 120 of the first embodiment and the pixel electrode 210 of the second embodiment, the common electrode may be absent from the peripheral region CA, and with the exception of the coupling pattern 210P, the pixel electrode may also be absent from the peripheral region CA of the contact hole CNT.

By way of summation and review, the display substrate includes the peripheral region CA of the contact hole CNT that partially exposes an electrode of the switching device, the peripheral region having an insulating layer having a profile that slants and/or curves in the slanted area SA about the contact hole CNT. In the slanted area of the peripheral area of the contact hole, as the profile of the insulating layer is not horizontal and a curve may be formed, the lifting phenomenon may occur with respect to an electrode pattern near the contact hole. The electrode pattern that is protruded due to the lifting phenomenon may perforate the insulating layer, thereby shorting of the pixel electrode to the common electrode.

In the display substrate according to one or more embodiments, the presence of at least one of the pixel electrode and the common electrode in the peripheral region CA about the contact hole CNT is minimized or eliminated, thereby preventing an electrical short from occurring in the peripheral region of the contact hole. As a result, the yield and productivity of the display substrate and the display device including the display substrate may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display substrate, comprising:
   a base substrate including a switching device including an electrode;
   a gate insulating layer in direct physical contact with the base substrate;
   a first insulating layer arranged over and in direct physical contact with the gate insulating layer, said first insulating layer being perforated by a contact hole exposing the electrode of the switching device;
   a first electrode arranged over and in direct physical contact with the first insulating layer;
   a second insulating layer arranged over and in direct physical contact with the first electrode; and
   a second electrode arranged over and in direct physical contact with the second insulating layer, wherein the first electrode is coupled to the electrode of the switching device via the contact hole, and solely a portion of either the first electrode or the second electrode is over a surface area of a peripheral region of the contact hole and the first electrode and the second electrode stacked on the base substrate.

2. The display substrate of claim 1, further comprising a light shielding area that overlaps a region corresponding to the contact hole and the peripheral region of the contact hole.

3. The display substrate of claim 2, wherein the peripheral region of the contact hole includes a slanted area of the first insulating layer near the contact hole, the slanted area having a predetermined slope angle.

4. The display substrate of claim 1, wherein the first electrode is a pixel electrode and the second electrode is a common electrode.

5. The display substrate of claim 4, wherein the first insulating layer has a thickness of 2 to 3 microns and a thickness of the second insulating layer is about 70 nm.

6. The display substrate of claim 4, wherein the switching device includes a gate electrode, a source electrode and a drain electrode, and wherein the drain electrode is coupled to the pixel electrode via the contact hole.

7. The display substrate of claim 4, wherein the pixel electrode is absent from a majority of a surface area of the peripheral region about the contact hole.

8. The display substrate of claim 5, except for where the pixel electrode is electrically connected to the electrode of the switching device, the pixel electrode is absent from the peripheral region about the contact hole.

9. The display substrate of claim 5, except for where the pixel electrode is electrically connected to the electrode of the switching device by a coupling pattern, the pixel electrode is absent from the peripheral region about the contact hole.

10. The display substrate of claim 9, wherein the common electrode is absent from the contact hole and from the peripheral region about the contact hole.

11. The display substrate of claim 1, wherein the first electrode and the second electrode are comprised of a transparent electrode material.

12. The display substrate of claim 1, wherein the second electrode is patterned to include a plurality of branch electrodes in parallel with each other.

13. The display substrate of claim 1, further comprising a plurality of data lines and a plurality of gate lines over the substrate and coupled to the switching device.

14. A display substrate, comprising:
   a base substrate including a switching TFT including a drain electrode;
   a gate insulating layer in direct physical contact with the base substrate;
   a first insulating layer arranged over and in direct physical contact with the gate insulating layer, said first insulating layer being perforated by a contact hole exposing the drain electrode of the switching TFT, the first insulating layer having a curved and slanted profile in a peripheral region about the contact hole;
   a pixel electrode arranged over and in direct physical contact with the first insulating layer;
   a second insulating layer arranged over and in direct physical contact with the first electrode; and
   a common electrode arranged over and in direct physical contact with the second insulating layer, wherein the pixel electrode is coupled to the drain electrode of the switching TFT via the contact hole, and wherein at least one of the pixel electrode and the common electrode is absent from a majority of a surface area of the peripheral region of the contact hole to prevent the common electrode and the pixel electrode from delaminating and shorting together within the peripheral region of the contact hole, and the pixel electrode and the common electrode stacked on the base substrate.

15. The display substrate of claim 14, wherein the peripheral region of the contact hole includes a slanted area of the first insulating layer near the contact hole, the slanted area having a predetermined slope angle.

16. The display substrate of claim 14, wherein the pixel electrode is absent from a majority of a surface area of the peripheral region about the contact hole.

* * * * *